United States Patent
Cheng et al.

(10) Patent No.: US 10,990,141 B2
(45) Date of Patent: Apr. 27, 2021

(54) CONNECTION BETWEEN PARALLEL SYSTEM BOARD AND POWER BOARD

(71) Applicants: FOXCONN (KUNSHAN) COMPUTER CONNECTOR CO., LTD., Kunshan (CN); FOXCONN INTERCONNECT TECHNOLOGY LIMITED, Grand Cayman (KY)

(72) Inventors: Shan-Yong Cheng, New Taipei (TW); Hao-Yun Ma, San Jose, CA (US)

(73) Assignees: FOXCONN (KUNSHAN) COMPUTER CONNECTOR CO., LTD., Kunshan (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 16/597,858

(22) Filed: Oct. 10, 2019

(65) Prior Publication Data
US 2020/0117247 A1 Apr. 16, 2020

Related U.S. Application Data

(60) Provisional application No. 62/743,568, filed on Oct. 10, 2018.

(51) Int. Cl.
| G06F 1/18 | (2006.01) |
| H05K 7/20 | (2006.01) |
| H05K 5/00 | (2006.01) |
| G06F 1/20 | (2006.01) |

(52) U.S. Cl.
CPC .............. *G06F 1/181* (2013.01); *G06F 1/183* (2013.01); *G06F 1/20* (2013.01); *H05K 5/006* (2013.01); *H05K 7/2039* (2013.01); *G06F 2200/20* (2013.01)

(58) Field of Classification Search
CPC ..... G06F 1/183; H05K 7/1023; H05K 7/1084
See application file for complete search history.

(56) References Cited

U.S. PATENT DOCUMENTS

| 7,298,622 B2* | 11/2007 | Conner | ............... H01L 23/4006 257/E23.084 |
| 7,344,918 B2* | 3/2008 | Tran | ........................ H01L 23/50 257/E23.079 |
| 7,448,879 B2* | 11/2008 | Jin | ..................... H01R 12/7076 439/331 |
| 2005/0276029 A1* | 12/2005 | Lober | ................ H01R 13/2442 361/769 |

* cited by examiner

*Primary Examiner* — Mukundbhai G Patel
(74) *Attorney, Agent, or Firm* — Ming Chieh Chang; Wei Te Chung

(57) ABSTRACT

An electrical assembly includes a system board and a power board closely arranged with each other in a parallel relation. An electronic package and a system connector are mounted upon an upper surface of the system board. A power connector and a set of connector units are mounted on an undersurface of the power board. Another set of connector units are formed on an upper surface of the electronic package. A heat sink is positioned upon the power board and contacts the electronic package via a center opening in the power board. After assembled, the power supply is provide through connection between the two sets of the connector units and that between the system connector and the power connector.

10 Claims, 10 Drawing Sheets

10

CONNECTION BETWEEN PARALLEL SYSTEM BOARD AND POWER BOARD

BACKGROUND OF THE DISCLOSURE

1. Field of the Disclosure

The invention relates to a connection arrangement between the paralleled system board and power board, and particularly to peripheral connectors between the power board and the system board, and between the power board and the electronic package mounted upon the system board.

2. Description of Related Arts

Power supply of the electronic package mounted upon the system board becomes tougher and tougher due to increment of the contacts/conductors thereof. Some approaches use the additional cable directly or indirectly extends around one side of the electronic package while there is an potential risk of interference between the cable and the corresponding heat sink which is intinately positioned upon the electronic package.

An improved interconnection arrangement without the cable is desired.

SUMMARY OF THE DISCLOSURE

An object of the invention is to provide an additional connection mechanism between the system board and the electronic package, i.e., the CPU (Central Processing Unit), in a cable-free manner.

An electrical assembly includes a system board and a power board closely arranged with each other in a parallel relation. An electronic package and a system connector are mounted upon an upper surface of the system board. A power connector and a set of connector units are mounted on an undersurface of the power board. Another set of connector units are formed on an upper surface of the electronic package. A heat sink is positioned upon the power board and contacts the electronic package via a center opening in the power board. After assembled, the power supply is provide through connection between the two sets of the connector units and that between the system connector and the power connector.

Other objects, advantages and novel features of the disclosure will become more apparent from the following detailed description when taken in conjunction with the accompanying drawings.

DETAILED DESCRIPTION OF THE PREFERRED EMBODIMENT

Figure 1A:
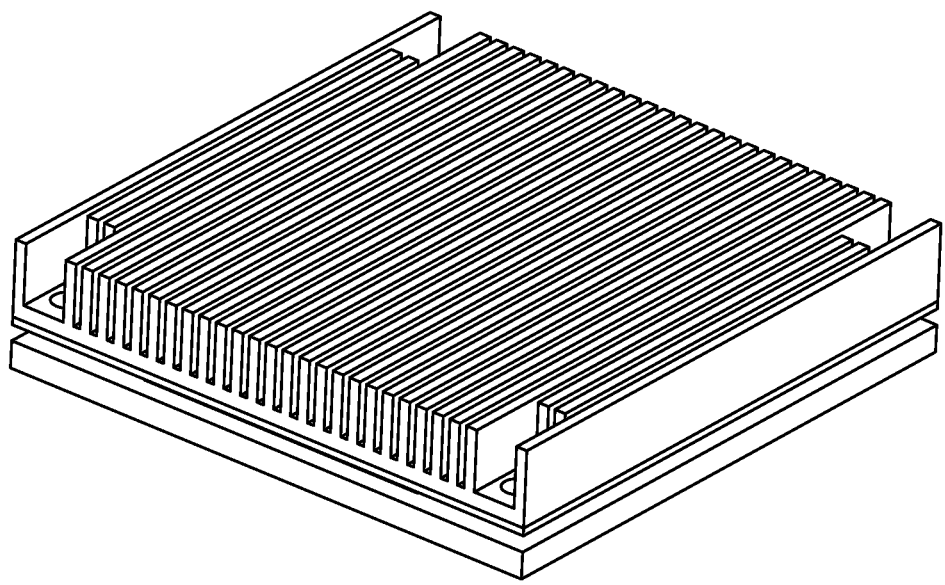
FIG. 1(A) is a downward perspective view of the electrical assembly including the system board and the power board and the connector assembly therebetween and a heat sink thereupon.
Figure 1B:
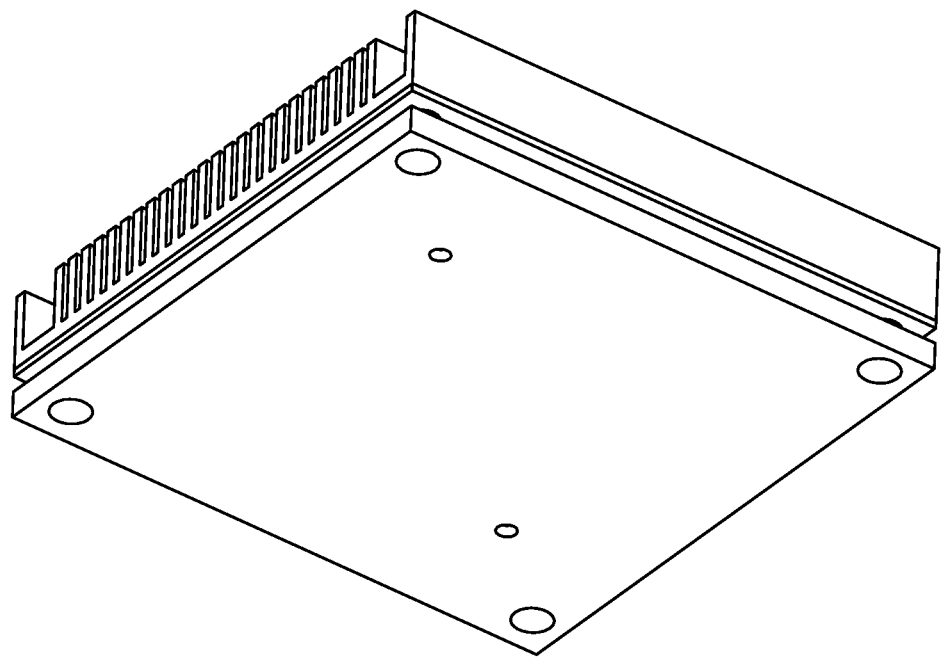
FIG. 1(B) is an upward perspective view of the electrical assembly of FIG. 1(A)
Figure 2A:
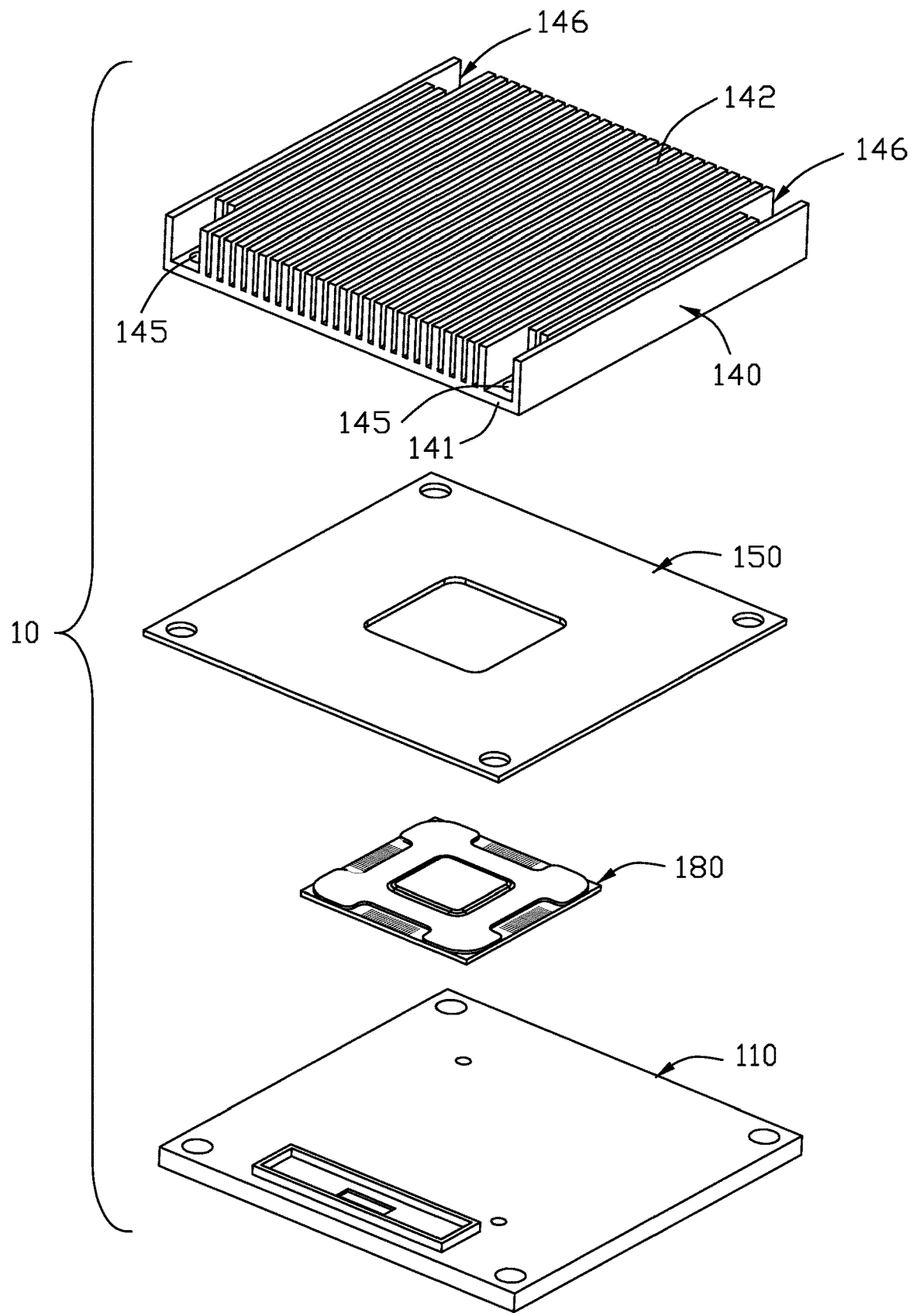
FIG. 2(A) is a downward exploded perspective view of the electrical assembly of FIG. 1(A) wherein the electronic package and the connector are removed away from the system board.
Figure 2B:
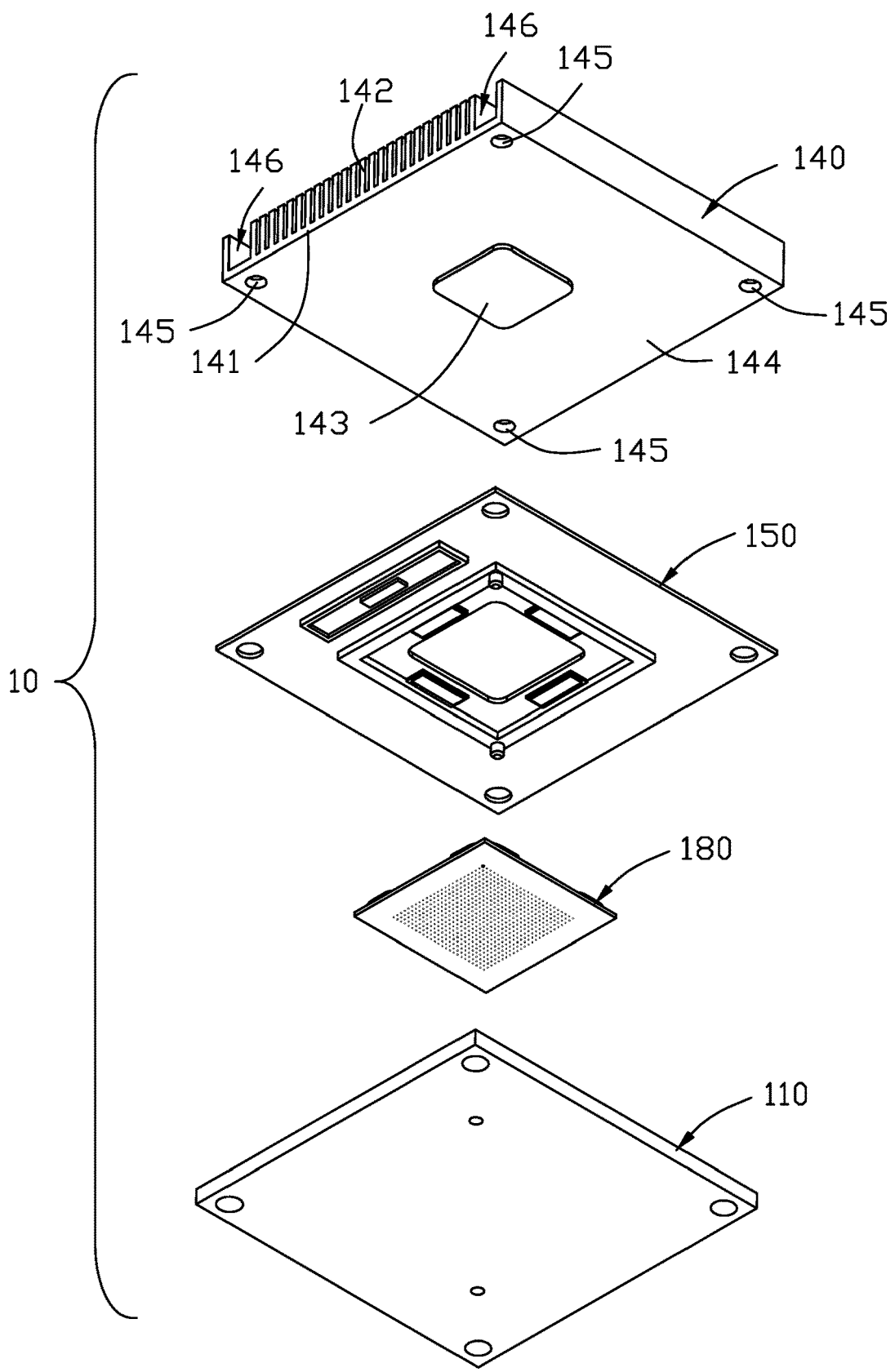
FIG. 2(B) is an upward exploded perspective view of the electrical assembly of FIG. 2(A)
Figure 3A:
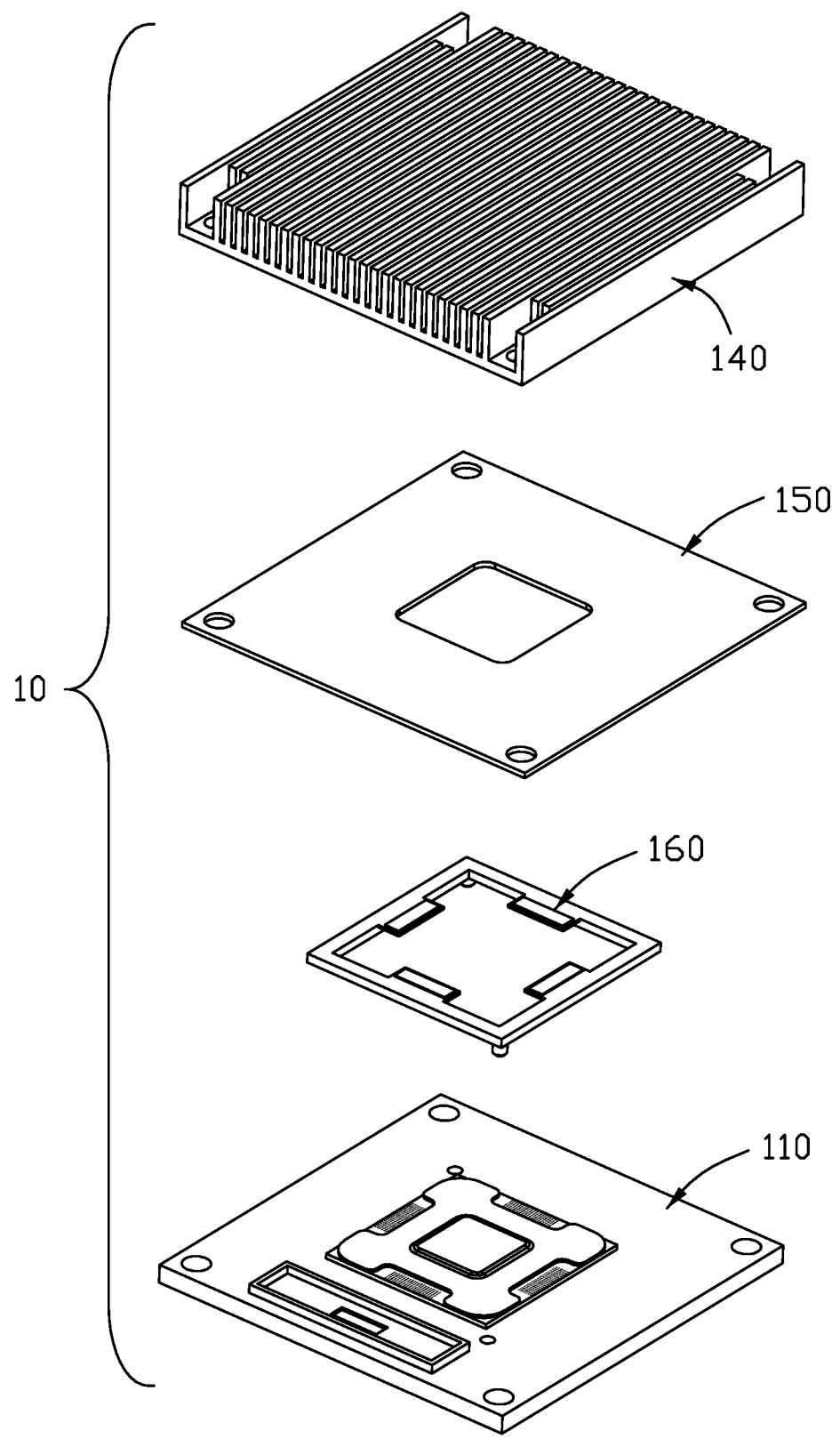
FIG. 3(A) is a downward exploded perspective view of the electrical connector of FIG. 1(A) wherein the connector sub-assembly is removed from the power board.
Figure 3B:
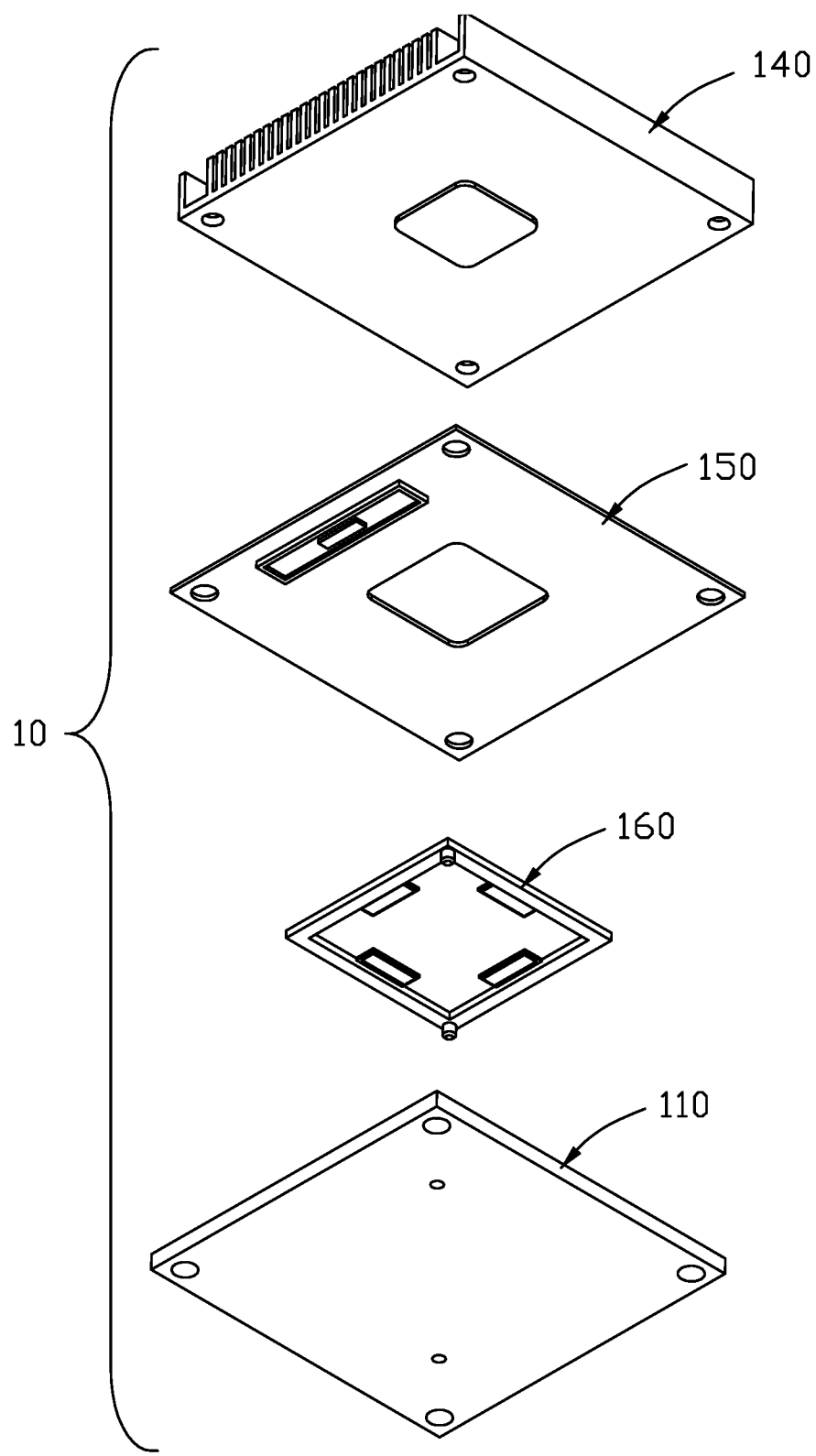
FIG. 3(B) is an upward exploded perspective view of the electrical assembly of FIG. 3(A)
Figure 4A:
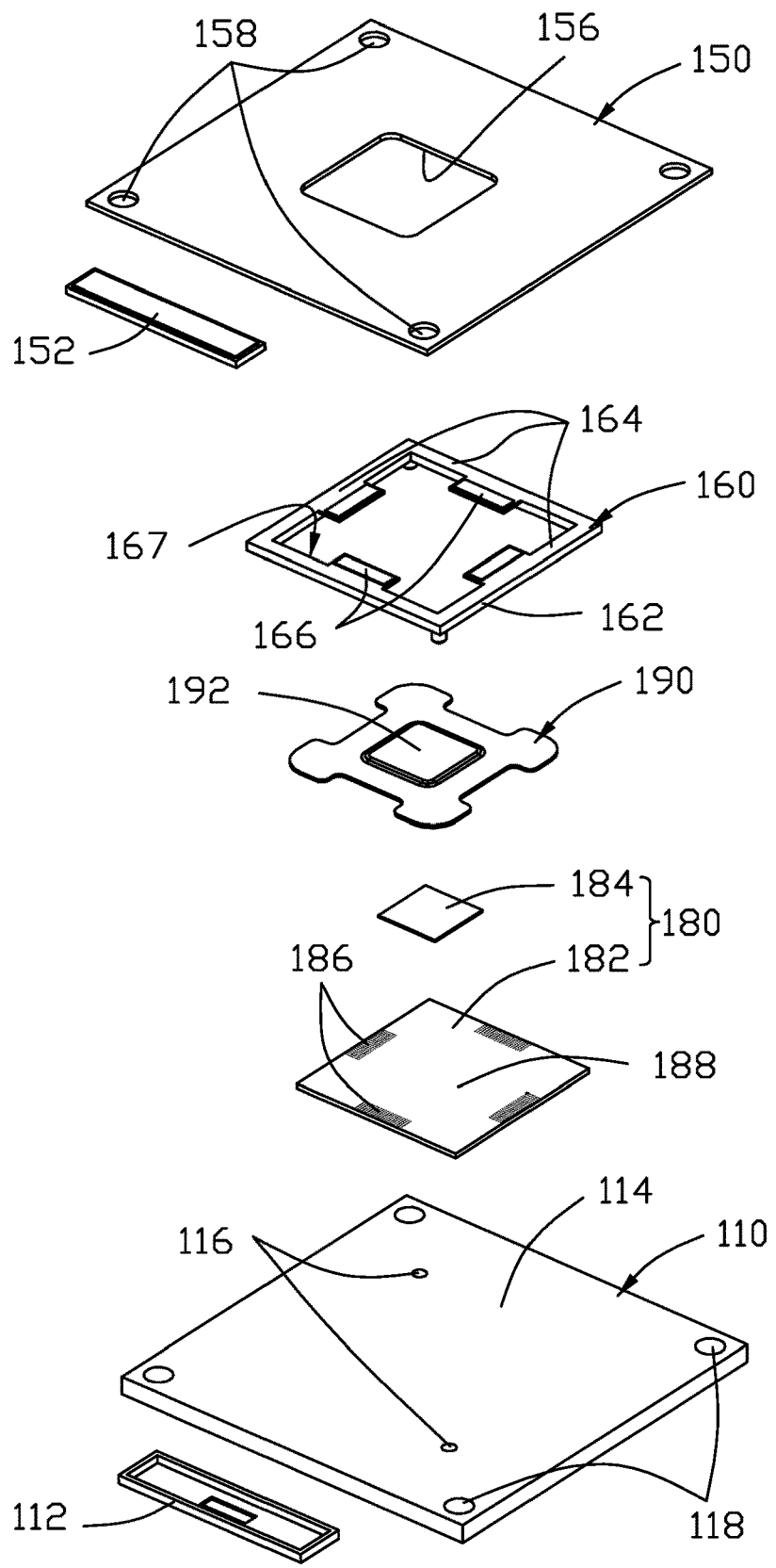
FIG. 4(A) is a downward further exploded perspective view of the electrical assembly of FIG. 3(A)
Figure 4B:
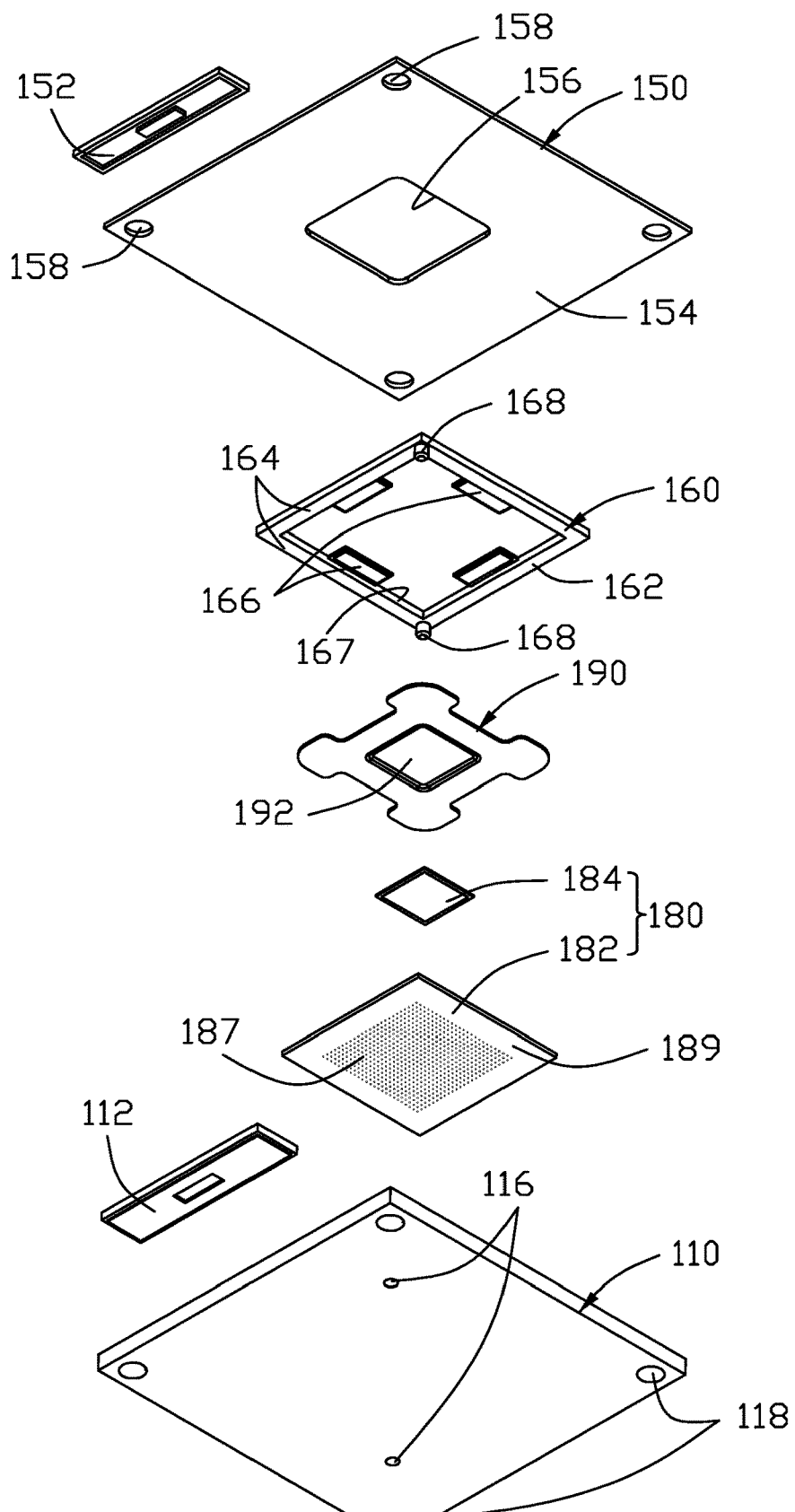
FIG. 4(B) is an upward further exploded perspective view of the electrical assembly of FIG. 4(A)
Figure 5A:
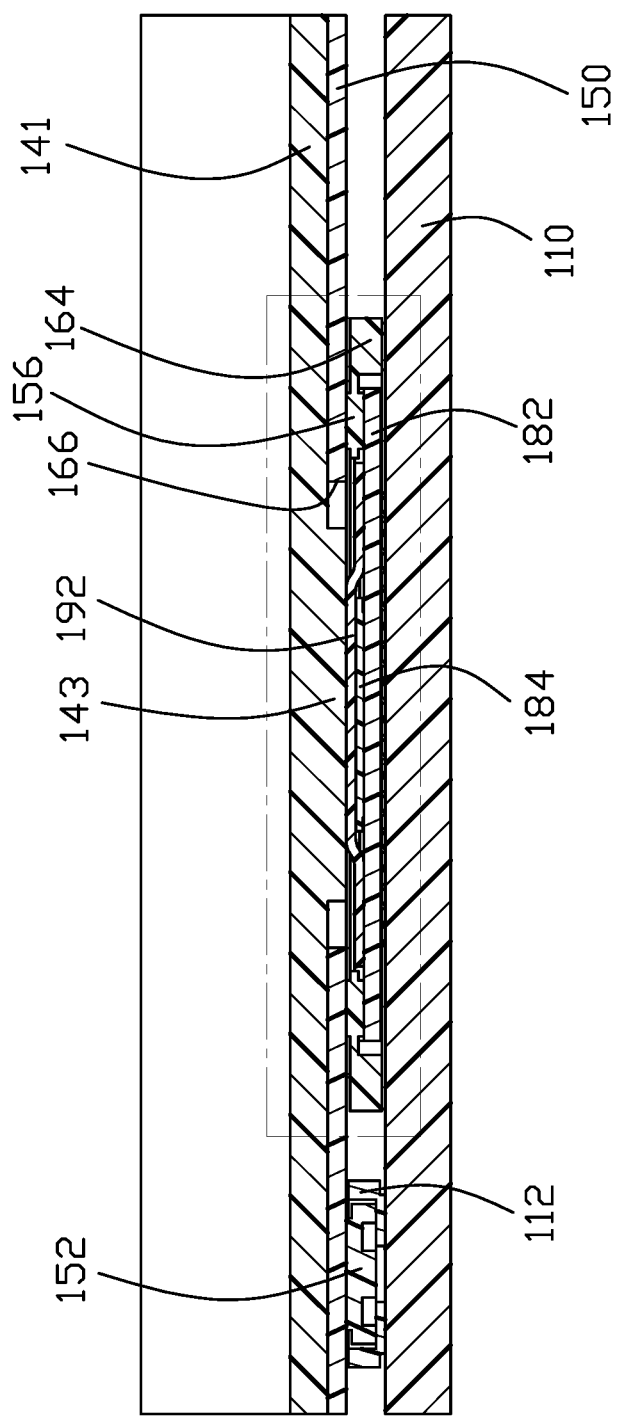
FIG. 5(A) is a cross-sectional view of the electrical assembly of FIG. 1(A)
Figure 5B:
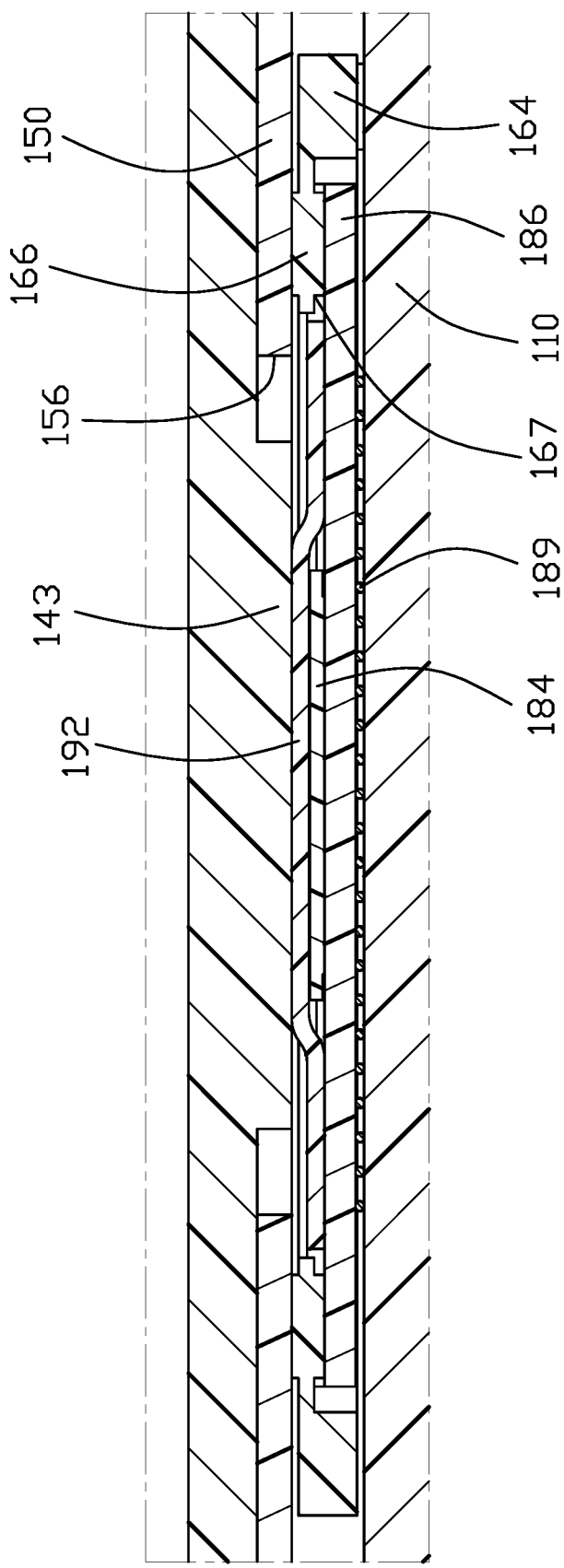
FIG. 5(B) is an enlarged cross-sectional view of the electrical assembly of FIG. 5(A)

Referring to FIGS. 1(A)-5(B), an electrical assembly 10 includes a system board 110 and a power board 150 arranged parallel to each other. An board-to-board receptacle type electrical connector 112 without showing the contacts, is mounted upon a side region of an upper surface 114 of the system board 110. A pair of positioning holes 116 are formed in the system board 110. Four through holes 118 are formed at four corners of the system board 110. A board-to-board plug type electrical connector 152 without showing the contacts, is mounted upon a side region of an undersurface 154 of the power board 150. A through opening 156 is located in a center region of the power board 150. Four through holes 158 are formed at four corners of the power board 150 in alignment with the corresponding through holes 118 in the vertical direction, respectively. A connector sub-assembly 160 is mounted upon the undersurface 154 of the power board 150, and includes an insulative frame like housing 162 composed of four bars 164 each equipped with a LGA type socket connector unit 166, without showing the contacts, extending laterally into the interior space 167 of the frame like housing 162. A pair of positioning posts 168 downwardly extend from two corresponding corners of the housing 162 and adapted to be received within the corresponding holes 116 of the system board 110 when assembled.

An electronic package 180 includes a substrate 182 and a die 184 attached upon an upper surface 188 of the substrate 182. Four connector units 186 with LGA pad type contacts are located on four side regions of the upper surface 188 of the substrate 182 for mating with the corresponding connector units 166 when assembled. A plurality of solder balls 189 are formed on an undersurface 187 of the substrate 182 so as to have the substrate 182 soldered upon the upper surface 114 of the system board 110. A metallic heat spreading plate or heat spreader 190 is positioned upon the upper surface 188 of the substrate 182 with a raised region 192 to cover and intimately contact the die 184 in the vertical direction.

A metallic heat sink 140 is positioned upon the power board 150, and includes a horizontal plate 141 with a plurality of fins 142 thereon. A protrusion 143 downward extends from an undersurface 144 of the plate 141 in alignment with the die 184 in the vertical direction, and four through holes 145 are located at four corners of the plate 141 in alignment with the corresponding through holes 158 and the corresponding through holes 118 in the vertical direction, respectively. Four received cavities 146 are formed at four corners of the heat sink 140 by removal of the corresponding fins 142 for receiving the preloaded screws (not shown) which are used to fasten the heat sink 140 and the system board 110 and the power board 150 therebetween by extension through the corresponding through holes 145, 158 and 118.

During assembling, the power board 150 and the system board 110 are closely parallel with each other the raised portion 192 of the heat spreader 190 extending upwardly through the interior space 167 of the frame like housing 162 to touch, in the vertical direction the protrusion 143 which is received within the through opening 156. The connector 112 on the system board 110 is mated with the connector 152 on the power board 150. The connector units 186 on the substrate 182 are mated with the corresponding connector units 166 on the power board 150. In this embodiment, the heat spreader 190 is located within the interior space 167 while laterally offset from the four connector units 166 which also share the same interior space 167 with the heat spreader 190. In this embodiment, the power may be supplied through the mated connectors 112 and 152, and the mated connector units 166 and 186. In this embodiment, the electronic package 180 is directly mounted upon the upper surface 114 of the system board 110. Anyhow, such an electronic package 180 may be indirectly mounted upon the upper surface 114 of the system board 110 via an electrical connector, i.e., the traditional connector for receiving the CPU therein. In this embodiment, the interior space 167 in the frame like housing 162 defines an lower level region and an upper level region wherein the substrate 182 of the electronic package 180 is located in the lower level region while the die 184 of the substrate 182 and the heat spreader 190 are located in the upper level region.

While a preferred embodiment in accordance with the present disclosure has been shown and described, equivalent modifications and changes known to persons skilled in the art according to the spirit of the present disclosure are considered within the scope of the present disclosure as described in the appended claims.

What is claimed is:

1. An electrical assembly comprising:
   a system board defining an upper surface thereon;
   a power board closely arranged with regard to the system board in a parallel relation, and defining an undersurface thereon;
   a system connector and an electronic package mounted upon the upper surface of the system board;
   a power connector and a set of connector units mounted upon the undersurface of the power board; and
   another set of connector units mounted upon an upper surface of the electronic package; wherein
   after assembled, in a vertical direction the power connector is mated with system connector, and the set of connector units are mated with said another set of connector units; wherein
   the power board forms a through opening, and a heat sink is positioned upon the power board with a protrusion downwardly extending into the through opening; wherein
   a heat spreader is intimately positioned upon the electronic package, and the set of connector units commonly form an interior space into which the heat spreader extends upwardly to contact the protrusion of the heat sink; wherein
   said set of connector units belong to a connector sub-assembly having four bars to commonly form a frame like housing in which the heat spreader is received; wherein
   the frame like housing includes a plurality of downwardly extending positioning posts at corresponding corners, and the system board forms corresponding holes to receive the positioning posts, respectively, to secure the housing upon the system board; wherein
   the electronic package is received within the frame like housing and directly downwardly mounted upon the system board.

2. The electrical assembly as claimed in claim 1, wherein the set of connector units are closer to a center of the power board than the power connector.

3. An electrical assembly comprising:
   a system board defining an upper surface thereon;
   a power board closely arranged with regard to the system board in a parallel relation, and defining an undersurface thereon;
   an electronic package mounted upon the upper surface of the system board;
   a set of connector units mounted upon the undersurface of the power board; and
   another set of connector units mounted upon an upper surface of the electronic package; wherein
   after assembled, in a vertical direction the set of connector units are mated with said another set of connector units; wherein
   the power board forms a through opening, and a heat sink is positioned upon the power board with a protrusion downwardly extending into the through opening; wherein
   a heat spreader is intimately positioned upon the electronic package, and the set of connector units commonly form an interior space into which a central raised portion of the heat spreader extends upwardly to contact the protrusion of the heat sink; wherein
   said set of connector units belong to a connector sub-assembly having four bars to commonly form a frame like housing in which the heat spreader is received; wherein
   the heat spreader is snugly and compliantly received within the connector sub-assembly in a plan view along the vertical direction; wherein
   said set of connector units include four connector units respectively located at middle regions of the corresponding four bars, and the heat spreader forms four diagonal protrusions at four corners so as to be alternately arranged with the said four connector units circumferentially with regard to the central raised portion when assembled.

4. The electrical assembly as claimed in claim 3, wherein the electronic package further includes a die upwardly intimately contacting a raised portion of the heat spreader extending into the interior space.

5. The electrical assembly as claimed in claim 3, wherein the power board has four first through holes at corresponding four corners, the system board has four second through holes at corresponding four corners, and the heat sink has four third through holes at corresponding four corners, all said first though holes, said corresponding second through holes and said corresponding third through holes being aligned together in the vertical direction, respectively.

6. The electrical assembly as claimed in claim 3, wherein the set of connector units includes a pair of positioning posts extending into corresponding pair of holes in the system board.

7. An electrical assembly comprising:
   a system board defining an upper surface thereon;
   a power board closely arranged with regard to the system board in a parallel relation, and defining an undersurface thereon and a through hole therein;
   a heat sink is positioned upon the power board;
   an electronic package mounted upon the upper surface of the system board;

a set of connector units mounted upon the undersurface of the power board; and another set of connector units mounted upon an upper surface of the electronic package; wherein after assembled, in a vertical direction and the set of connector units are mated with said another set of connector units; wherein a heat spreader intimately positioned upon a die of the electronic package and intimately contacting the heat sink through said through hole;

further including a power connector mounted upon the undersurface of the power board, and a system connector mounted upon the upper surface of the system board and mated with the power connector in the vertical direction without involvement of the electronic package.

8. The electrical assembly as claimed in claim 7, wherein the power board has four first through holes at corresponding four corners, the system board has four second through holes at corresponding four corners, and the heat sink has four third through holes at corresponding four corners, all said first though holes, said corresponding second through holes and said corresponding third through holes being aligned together in the vertical direction, respectively.

9. The electrical assembly as claimed in claim 7, wherein said set of connector units belonging to a connector subassembly having four bars commonly form a frame like housing.

10. The electrical assembly as claimed in claim 7, wherein said spreader is snugly and compliantly received within the frame like housing in a plan view in the vertical direction.

* * * * *